US009348007B2

United States Patent
Son et al.

(10) Patent No.: US 9,348,007 B2
(45) Date of Patent: May 24, 2016

(54) MAGNETIC RESONANCE IMAGING METHOD AND APPARATUS

(71) Applicant: Samsung Electronics Co., Ltd., Suwon-si (KR)

(72) Inventors: Jong-bum Son, Seongnam-si (KR); Seong-deok Lee, Seongnam-si (KR); Jae-mock Yi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 700 days.

(21) Appl. No.: 13/668,282

(22) Filed: Nov. 4, 2012

(65) Prior Publication Data

US 2013/0127459 A1    May 23, 2013

(30) Foreign Application Priority Data

Nov. 4, 2011    (KR) .................. 10-2011-0114504

(51) Int. Cl.
*G01V 3/00*    (2006.01)
*G01R 33/48*    (2006.01)
*G01R 33/56*    (2006.01)

(52) U.S. Cl.
CPC ............ *G01R 33/48* (2013.01); *G01R 33/4828* (2013.01); *G01R 33/5602* (2013.01)

(58) Field of Classification Search
CPC ...................................... G01R 33/48
USPC ........................................ 324/307
See application file for complete search history.

(56) References Cited

U.S. PATENT DOCUMENTS

| | | | | |
|---|---|---|---|---|
| 5,144,235 A * | 9/1992 | Glover et al. | ................. | 324/309 |
| 5,214,382 A * | 5/1993 | Harms et al. | .................. | 324/309 |
| 5,235,278 A * | 8/1993 | McKinnon et al. | ........... | 324/309 |
| 5,254,949 A * | 10/1993 | McDonald et al. | ........... | 324/309 |
| 5,321,359 A * | 6/1994 | Schneider | ...................... | 324/307 |
| 5,327,087 A * | 7/1994 | Hafner et al. | ................. | 324/309 |
| 7,112,963 B2 * | 9/2006 | Hasegawa et al. | ............ | 324/307 |
| 8,558,543 B2 * | 10/2013 | Miyoshi | ........................ | 324/306 |
| 2003/0178994 A1 * | 9/2003 | Hurlimann et al. | ........... | 324/303 |
| 2005/0122105 A1 * | 6/2005 | Avram et al. | .................. | 324/314 |
| 2007/0007958 A1 * | 1/2007 | Foo | ................................ | 324/307 |
| 2008/0150525 A1 * | 6/2008 | Song | .............................. | 324/307 |
| 2009/0027051 A1 * | 1/2009 | Stuber et al. | ................... | 324/309 |
| 2010/0134107 A1 * | 6/2010 | Kitamoto | ........................ | 324/309 |
| 2011/0234220 A1 * | 9/2011 | Mitchell et al. | ................ | 324/303 |
| 2012/0194193 A1 * | 8/2012 | Rehwald et al. | ............... | 324/318 |
| 2012/0235678 A1 * | 9/2012 | Seiberlich et al. | ............. | 324/307 |
| 2013/0193972 A1 * | 8/2013 | Kitane | ........................... | 324/318 |
| 2013/0307542 A1 * | 11/2013 | Chen | .............................. | 324/318 |
| 2013/0325408 A1 * | 12/2013 | Song | .............................. | 702/189 |
| 2014/0292330 A1 * | 10/2014 | Gulani et al. | .................. | 324/309 |
| 2015/0131884 A1 * | 5/2015 | Kimura | ........................ | 382/131 |
| 2015/0145513 A1 * | 5/2015 | Li et al. | ......................... | 324/303 |

FOREIGN PATENT DOCUMENTS

| | | |
|---|---|---|
| JP | 2006-325834 A | 12/2006 |
| KR | 10-2006-0051101 A | 5/2006 |
| KR | 10-0610990 B1 | 8/2006 |

* cited by examiner

*Primary Examiner* — Rodney Fuller
(74) *Attorney, Agent, or Firm* — NSIP Law

(57) ABSTRACT

A magnetic resonance imaging (MRI) method includes applying a radio-frequency (RF) pulse to a subject including different tissues all including a same type of atomic nuclei to rotate magnetization directions of the atomic nuclei of the different tissues; applying an RF pulse sequence to the subject based on the magnetization directions of the atomic nuclei of the different tissues; and obtaining magnetic resonance signals from the different tissues in response to the RF pulse sequence.

22 Claims, 5 Drawing Sheets

//MAGNETIC RESONANCE IMAGING METHOD AND APPARATUS

CROSS-REFERENCE TO RELATED APPLICATIONS

This application claims the benefit of Korean Patent Application No. 10-2011-0114504 filed on Nov. 4, 2011, in the Korean Intellectual Property Office, the disclosure of which is incorporated herein by reference in its entirety for all purposes.

BACKGROUND

1. Field

This disclosure relates to magnetic resonance imaging (MRI) methods and apparatuses that effectively differentiate tissues of a subject undergoing MRI in order to separate images of the tissues of the subject.

2. Description of Related Art

Magnetic resonance imaging (MRI) is a technique that exposes atomic nuclei to a magnetic field and obtains an image by using information obtained through resonance of the atomic nuclei. Resonance is a phenomenon where when a specific high-frequency wave is incident on atomic nuclei magnetized by an external magnetic field, the atomic nuclei absorb the high-frequency wave and are excited from a low energy state to a high-energy state. Atomic nuclei have resonance frequencies that vary according to types of the atomic nuclei, and resonance is affected by the strength of an external magnetic field. A number of different atomic nuclei exist in a human body, and hydrogen nuclei are generally used in MRI.

In particular, in MRI, various methods of differentiating tissues constituting a human body and removing a signal of a specific tissue have been studied. Examples include a method using chemical-shift selective saturation (CHESS) imaging and a method using Dixon water/fat imaging. The method using CHESS imaging uses a difference in a resonance frequency due to a difference in a chemical shift between two tissues in order to differentiate the two tissues. The method using Dixon water/fat imaging uses a difference in an image phase due to a difference in a resonance frequency between two tissues. In this case, since the chemical shift, the resonance frequency, and the image phase are proportional to one another, it is difficult for the method using CHESS imaging and the method using Dixon water/fat imaging to differentiate the two tissues unless there is a sufficient difference in a chemical shift and a resonance frequency between the two tissues.

SUMMARY

In one general aspect, a magnetic resonance imaging (MRI) method includes applying a radio-frequency (RF) pulse to a subject including different tissues all including a same type of atomic nuclei to rotate magnetization directions of the atomic nuclei of the different tissues; applying an RF pulse sequence to the subject based on the magnetization directions of the atomic nuclei of the different tissues; and obtaining magnetic resonance signals from the different tissues in response to the RF pulse sequence.

The applying of the RF pulse sequence may include determining whether a time required for the magnetization direction of the atomic nuclei of any one of the different tissues to recover to a state of the magnetization direction before the RF pulse was applied has elapsed since the RF pulse was applied; and when a result of the determining is that the time has elapsed, applying the RF pulse sequence to the subject.

The state of the magnetization direction before the RF pulse was applied may be a state in which the magnetization direction is aligned in a direction of a static magnetic field that existed in the subject before the RF pulse was applied.

The time may depend on a difference in a spin-lattice relaxation time of the atomic nuclei between the different tissues.

The time may depend on a difference in a spin-spin relaxation time of the atomic nuclei between the different tissues.

The applying of the RF pulse sequence may include applying a first RF pulse of the RF pulse sequence when an angle between the magnetization directions of the atomic nuclei of two of the different tissues is 180°.

The different tissues may have spectrums indicating chemical shifts that overlap one another.

One of the different tissues may be water, and another one of the different tissues may be cerebrospinal fluid.

One of the different tissues may be silicone, and another one of the different tissues may be fat.

The RF pulse may have a frequency band including resonance frequencies of the atomic nuclei of the different tissues.

The RF pulse sequence may be a spin-echo pulse sequence or a gradient-echo pulse sequence.

In another general aspect, a non-transitory computer-readable storage medium stores a program for controlling a computer to perform the MRI method described above.

In another general aspect, a magnetic resonance imaging (MRI) apparatus includes a radio-frequency (RF) coil unit configured to apply, to a subject including different tissues all including a same type of atomic nuclei, an RF pulse to rotate magnetization directions of the atomic nuclei of the different tissues, and an RF pulse sequence; a control unit configured to determine a time when the RF pulse sequence is to be applied based on the magnetization directions of the atomic nuclei of the different tissues; and a signal obtaining unit configured to obtain the magnetic resonance signals from the different tissues in response to the RF pulse sequence.

The control unit may be further configured to determine whether a time required for the magnetization direction of the atomic nuclei of any one of the different tissues to recover to a state of the magnetization direction before the RF pulse was applied has elapsed since the RF pulse was applied; and apply the RF pulse sequence to the subject when the control unit determines that the time has elapsed.

The RF pulse may be a 180° RF pulse.

Other features and aspects will be apparent from the following detailed description, the drawings, and the claims.

DETAILED DESCRIPTION

Figure 1:
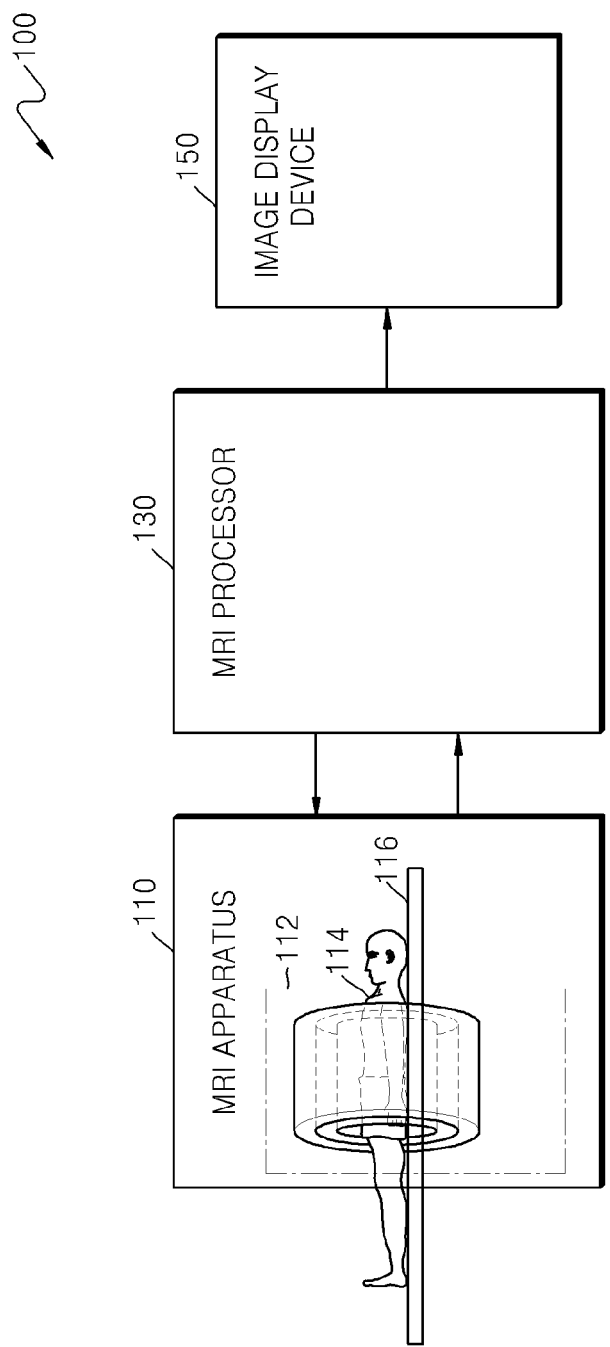
FIG. 1 is a block diagram illustrating an example of a magnetic resonance imaging (MRI) system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The examples disclosed in this application relate to a magnetic resonance imaging (MRI) method and apparatus, and a detailed description of material well known to one of ordinary skill in the art will not be given. Examples of atoms exhibiting magnetic resonance include $^1H$, $^{23}Na$, $^{31}P$, and $^{13}C$. Since hydrogen atoms are mainly used in MRI, a case where hydrogen atoms are imaged will be explained in the examples below.

FIG. 1 is a block diagram illustrating an example of an MRI system 100. The MRI system 100 includes an MRI apparatus 110, an MRI processor 130, and an image display device 150. Although elements constituting the MRI system 100 are physically separated in the example in FIG. 1, the example is not limited thereto, and the elements may be implemented as a single device.

The MRI apparatus 110 receives a control signal from the MRI processor 130, operates according to the control signal, obtains a magnetic resonance signal for generating a magnetic resonance image from a subject 114 located in a magnet system 112, and outputs the magnetic resonance signal to the MRI processor 130. The subject 114 is moved through the magnet system 112 by a cradle 116.

The MRI processor 130 receives the magnetic resonance signal from the MRI apparatus 110, generates a magnetic resonance image of the subject 114 by reconstructing the magnetic resonance signal, and transmits the magnetic resonance image to the image display device 150. The MRI processor 130 may include a user interface for receiving control information or the like from a user, an image processor for generating a magnetic resonance image by reconstructing a magnetic resonance signal, a storage unit for storing the magnetic resonance image and various information, and an input/output unit connected to the MRI apparatus 110 and the image display device 150.

The image display device 150 receives the magnetic resonance image generated by the MRI processor 130, and displays the magnetic resonance image on a display unit.

Figure 2:
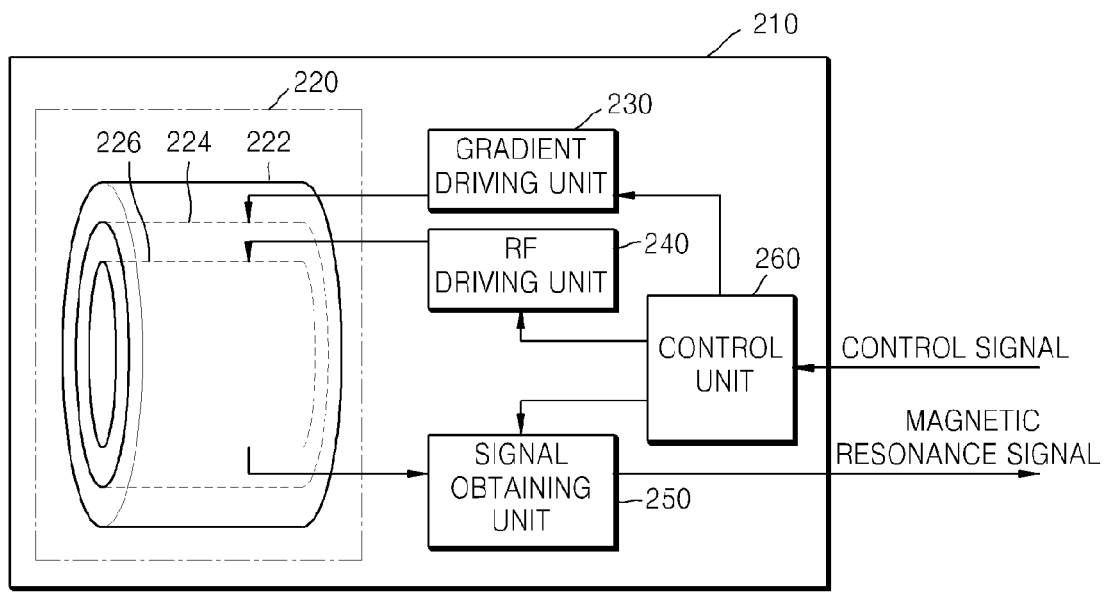
FIG. 2 is a block diagram illustrating an example of an MRI apparatus for obtaining a magnetic resonance signal in a MRI system.

FIG. 2 is a block diagram illustrating an example of an MRI apparatus 210 for obtaining a magnetic resonance signal in an MRI system. The MRI apparatus 210 applies a magnetic field and a high-frequency wave to a subject, and obtains a signal sensed from the subject in response to the magnetic field and the high-frequency wave. The MRI apparatus 210 includes a magnet system 220, a gradient driving unit 230, a radio-frequency (RF) driving unit 240, a signal obtaining unit 250, and a control unit 260. The magnet system 220 includes a main magnetic field coil unit 222, a gradient coil unit 224, and an RF coil unit 226. The MRI apparatus 210 may further include an amplifier for amplifying a signal and a low-pass filter for eliminating noise.

The main magnetic field coil unit 222, the gradient coil unit 224, and the RF coil unit 226 included in the magnet system 220 of the MRI apparatus 210 of FIG. 2 have cylindrical shapes and are concentric. In FIG. 2, the main magnetic field coil unit 222, the gradient coil unit 224, and the RF coil unit 226 are sequentially disposed from the outside of the MRI apparatus 210. The RF coil unit 226 is hollow, and thus a subject is to be located in the RF coil unit 226. A magnetic field and a high-frequency wave may be applied to the subject when the subject placed on a cradle is moved through the magnet system 220.

The main magnetic field coil unit 222 forms a static magnetic field in the magnet system 220. A direction of the static magnetic field may be parallel or perpendicular to a longitudinal direction of the subject. A case where a direction of the static magnetic field is parallel to a longitudinal direction of the subject will be explained in the examples below.

Hydrogen nuclei have magnetic moments, in other words, magnetic dipole moments, due to a spin motion, and directions of the magnetic moments are random when there is no external magnetic field. However, once hydrogen atoms are located in a static magnetic field, the hydrogen nuclei are either aligned or antialigned in a direction of the static magnetic field in order to change to a low energy state. For example, when a static magnetic field $B_0$ is applied to hydrogen atoms, hydrogen nuclei are aligned or antialigned in a direction of the static magnetic field $B_0$. However, since the hydrogen nuclei are spinning, the hydrogen nuclei are aligned and obliquely precess at an angle of a with respect to the direction of the static magnetic field $B_0$. A frequency of the precessional motion is referred to as a Larmor frequency F. The Larmor frequency F may be expressed as a function of a gyromagnetic ratio γ and an intensity of the static magnetic field $B_0$ by the following Equation 1.

$$F = \gamma B_0 \quad (1)$$

The gyromagnetic ratio γ is a proportional constant that has different values for different nuclei. Hydrogen nuclei have a Larmor frequency of 42.58 MHz in a magnetic field of 1.0 Tesla. When an electromagnetic wave having the Larmor frequency is applied to the hydrogen nuclei, the hydrogen nuclei change from a low energy state to a high-energy state. Examples of a magnet for forming the static magnetic field $B_0$ may include a permanent magnet, a room-temperature electromagnet, and a superconducting electromagnet.

The gradient coil unit 224 forms a gradient magnetic field having gradients in directions of three axes perpendicular to one another. The three axes are a slice axis, a frequency axis, and a phase axis. When the three axes in a space where the static magnetic field $B_0$ is formed are x, y, and z-axes, any one of the three axes may become a slice axis. In this case, one of the remaining two axes is a frequency axis and the other one is a phase axis. The slice axis may be set to a direction inclined at a specific angle with respect to the longitudinal direction of the subject. A case where the z-axis is a slice axis, the x-axis is a frequency axis, and the y-axis is a phase axis and the z-axis is a longitudinal direction of the subject will be explained in the examples below.

When the static magnetic field $B_0$ is applied to the subject, signals of tissues having similar properties are simultaneously emitted, thereby making it difficult to determine which signal comes from which tissue. In order to solve the problem, a gradient magnetic field is used. Hydrogen nuclei in a target region of the subject may be selectively resonated by using a gradient magnetic field in which a strength of a magnetic field and a Larmor frequency linearly vary along an axis. For example, assuming that a gradient magnetic field is applied in the longitudinal direction of the subject by using a gradient coil to generate a magnetic field having an intensity linearly varying from about 1.3 Tesla at one end of the subject in the longitudinal direction to about 1.7 Tesla at the other end of the subject in the longitudinal direction due to the static magnetic field $B_0$ and the gradient magnetic field, in order to obtain a magnetic resonance image of a specific section perpendicular to the longitudinal direction at a central position of the subject, a high-frequency wave having a Larmor frequency corresponding to 1.5 Tesla may be applied to the subject to selectively resonate hydrogen nuclei in the specific section. In this case, hydrogen nuclei located in sections other the specific section have different Larmor frequencies, and thus are not resonated.

The gradient coil unit 224 applies three types of gradients in the directions of the x, y, and z-axes of the subject. A gradient magnetic field is formed along the longitudinal axis of the subject in order to selectively excite the specific section perpendicular to the longitudinal direction of the subject. In this case, a slice selection gradient is applied. In order to obtain two-dimensional (2D) spatial information in a selected plane, i.e., the specific section, a frequency encoding gradient and a phase encoding gradient are applied. As such, in order to form a gradient magnetic field in the slice axis, the frequency axis, and the phase axis, the gradient coil unit 224 has three types of gradient coils.

The RF coil unit 226 applies an RF pulse for exciting the hydrogen nuclei in the subject. Also, the RF coil unit 226 obtains an electromagnetic wave generated when the excited hydrogen nuclei recover to a stable state. The obtained electromagnetic wave is referred to as a magnetic resonance signal. The RF coil unit 226 may apply any of various types of RF pulses to the subject, and may apply an RF pulse sequence composed of a plurality of RF pulses to the subject.

The gradient driving unit 230 is connected to the gradient coil unit 224, and outputs a signal for forming a gradient magnetic field to the gradient coil unit 224. The gradient driving unit 230 includes gradient driving circuits corresponding to the three types of gradient coils for the slice axis, the frequency axis, and the phase axis. The RF driving unit 240 is connected to the RF coil unit 226, and outputs a signal for applying an RF pulse and an RF pulse sequence to the RF coil unit 226.

The signal obtaining unit 250 is connected to the RF coil unit 226, and receives a magnetic resonance signal from the RF coil unit 226 and processes the magnetic resonance signal as digital data. The signal obtaining unit 250 may include an amplifier for amplifying the magnetic resonance signal, a demodulator for demodulating the amplified magnetic resonance signal, and an analog-to-digital converter (ADC) for converting the demodulated analog signal into digital data. The signal obtaining unit 250 may further include a storage unit for storing the digital data. The digital data is transmitted to an MRI processor.

The control unit 260 obtains a magnetic resonance signal by controlling the gradient driving unit 230, the RF driving unit 240, and the signal obtaining unit 250. The control unit 260 receives a control signal transmitted from the MRI processor, and controls the MRI apparatus 210. The control unit 260 may include a memory. The memory may store programs for operating the control unit 260 and various data for applying an RF pulse and an RF pulse sequence. For example, information about a gradient of a gradient magnetic field formed by the gradient coil unit 224, a frequency of an RF pulse based on an intensity of a magnetic field, an RF pulse duration time related to a rotation angle of magnetization of hydrogen nuclei, and an intensity of an RF pulse related to a rotational speed of the magnetization of the hydrogen nuclei may be stored in the memory. Also, information for each tissue about a time taken until a magnetization direction of hydrogen nuclei that is rotated when an RF pulse is applied to the hydrogen nuclei recovers to a direction of a static magnetic field that is formed before the RF pulse was applied may be stored in the memory.

Figure 3:
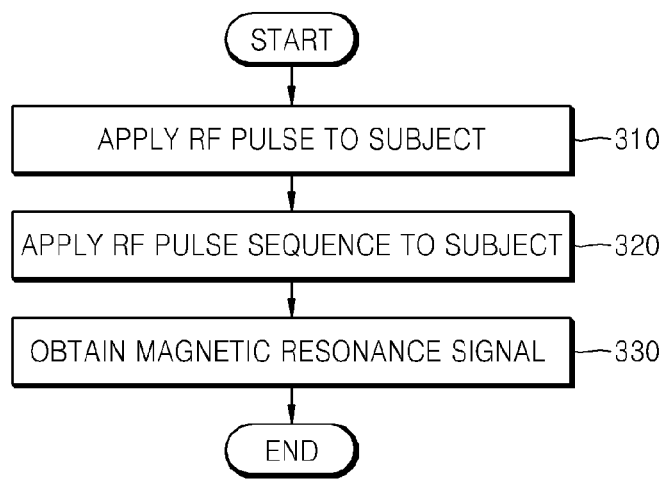
FIG. 3 is a flowchart illustrating an example of an MRI method.

FIG. 3 is a flowchart illustrating an example of an MRI method. Referring to FIG. 3, in operation 310, when a driving signal is input from the control unit 260 to the RF coil driving unit 240, the RF coil unit 226 receives a signal for applying an RF pulse from the RF coil driving unit 240 and applies an RF pulse to a subject. The subject placed on a cradle is moved through the magnet system 220 by the cradle. The subject may be a specific part of a human body. The specific part may be composed of a plurality of different tissues including a first tissue through an Nth tissue. Each tissue includes common atomic nuclei such as hydrogen nuclei that undergo magnetic resonance.

For example, when the subject is composed of two tissues, that is, a first tissue and a second tissue, the first tissue may be water and the second tissue may be fat. The water and the fat have a clear difference in a chemical shift. Water has a chemical shift of about 0 ppm and fat has a chemical shift of about 3.5 ppm. Since a difference between the chemical shifts of water and fat is about 3.5 ppm, the two tissues may be differentiated from each other in a magnetic resonance image. The difference of 3.5 ppm corresponds to a difference of about 224 Hz in a resonance frequency between water and fat at 1.5 Tesla.

Figure 4:
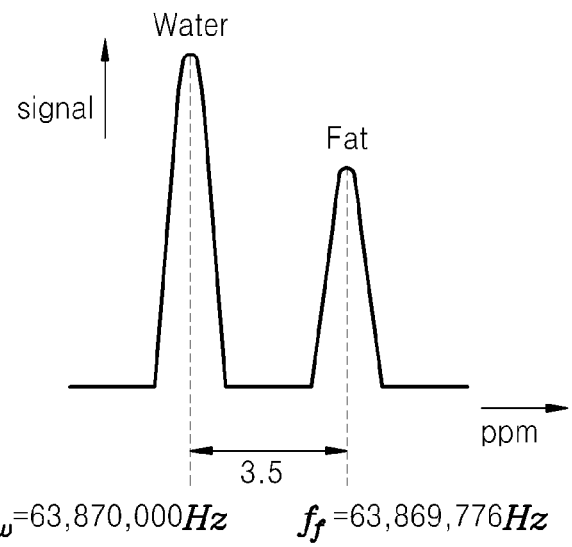
FIG. 4 is a graph illustrating an example of a difference in a resonance frequency between water and fat in a static magnetic field of 1.5 Tesla.

FIG. 4 is a graph illustrating an example of a difference in a resonance frequency between water and fat in a static magnetic field of 1.5 Tesla. Water has a resonance frequency $f_w$ of 63,870,000 Hz in a static magnetic field of 1.5 Tesla, and fat has a resonance frequency $f_f$ of 63,869,776 Hz in a static magnetic field of 1.5 Tesla, so a difference in a resonance frequency between the water and the fat is 224 Hz. Also, it is found from spectrums indicating chemical shifts that there is a difference of 3.5 ppm in a chemical shift between water and fat.

Alternatively, the first tissue may be water and the second tissue may be cerebrospinal fluid. Cerebrospinal fluid has a chemical shift of about 0 ppm, so the chemical shift of cerebrospinal fluid is similar to that of water, and spectrums indicating chemical shifts of the two tissues overlap each other. Alternatively, the first tissue may be silicone and the second tissue may be fat. When silicone is introduced into a human body through an operation or other procedure, the silicone may be regarded as a tissue constituting a subject. Since silicone has a chemical shift of about 4 ppm and fat has a chemical shift of about 3.5 ppm, a difference in a chemical shift between silicone and fat is only about 0.5 ppm. Since there is a difference of only about 32 Hz at 1.5 Tesla, spectrums indicating chemical shifts of the two tissues overlap each other. The methods disclosed in this application may be applied not only to a case where spectrums indicating chemical shifts of two tissues overlap each other, but also to a case where spectrums indicating chemical shifts of two tissues are close to each other. Accordingly, the methods disclosed in this application may be applied even to a case where it is difficult to differentiate tissues by using conventional methods such as the CHESS and Dixon methods because the two tissues have no clear difference in a chemical shift.

The subject is affected by a static magnetic field formed by the main magnetic field coil unit 222 before an RF pulse is applied by the RF coil unit 226. A magnetization direction of hydrogen nuclei of each tissue constituting the subject is aligned in a direction parallel to a direction of the static magnetic field due to the static magnetic field. Next, a gradient magnetic field is formed in a longitudinal direction of the subject by the gradient coil unit 224. Accordingly, the gradient magnetic field is already formed in the subject to which an RF pulse is to be applied.

The RF pulse applied to the subject has a frequency band that atomic nuclei of the first tissue and atomic nuclei of the second tissue constituting the subject to resonate. The atomic nuclei of the first tissue and the atomic nuclei of the second tissue have a difference in a resonance frequency due to a difference in a chemical shift therebetween. The RF pulse must have a frequency band including resonance frequencies of atomic nuclei of both tissues in order to simultaneously change magnetization directions of the atomic nuclei of both tissues. The RF pulse may be, for example, a 180° RF pulse.

When the 180° RF pulse is applied to the subject, magnetization directions of the hydrogen nuclei of the first tissue and the second tissue that are aligned in a direction parallel to the direction of the static magnetic field are rotated by 180° and become opposite to the magnetization directions before the 180° RF pulse was applied. Rotation angles of the magnetization directions of the hydrogen nuclei are related to a power of the RF pulse, and the power of the RF pulse depends on variables such as an RF pulse duration time during which the RF pulse is applied and an intensity of the RF pulse.

In operation 320, when a driving signal is input from the control unit 260 to the RF coil driving unit 240, the RF coil unit 226 receives a signal for applying an RF pulse sequence from the RF coil driving unit 240 and applies an RF pulse sequence to the subject. When an angle between the magnetization directions of the hydrogen nuclei in the different tissues, that is, the first tissue and the second tissue, reaches a specific angle, the control unit 260 applies an RF pulse sequence for obtaining a magnetic resonance signal to the subject, as will be explained in detail with reference to FIG. 5.

Figure 5:
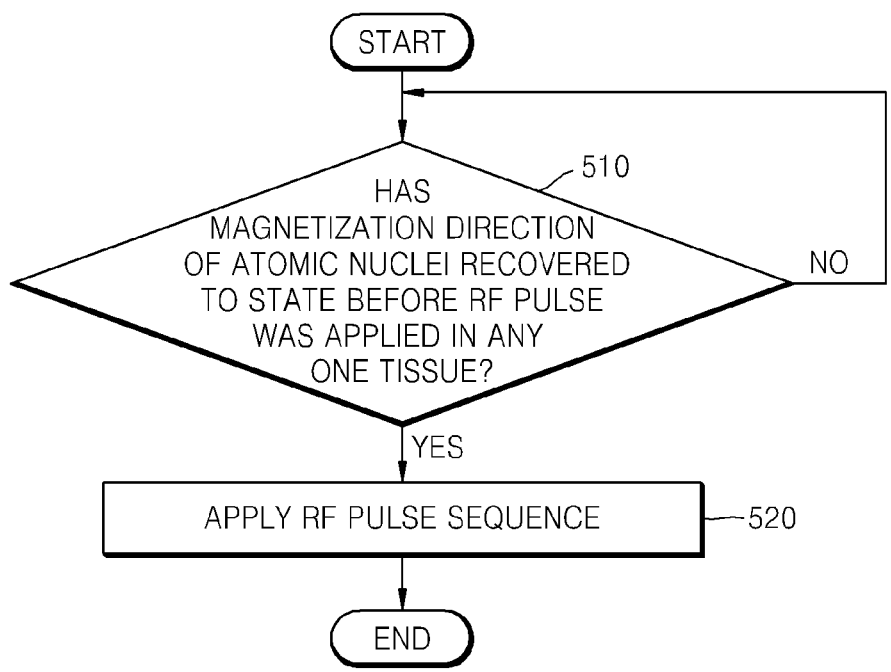
FIG. 5 is a flowchart illustrating an example of an operation of the method of FIG. 3.

FIG. 5 is a flowchart illustrating an example of an operation 320 of the method of FIG. 3. In operation 510, the control unit 260 determines whether the magnetization direction of the hydrogen nuclei of any one of the different tissues has recovered to a state before the RF pulse was applied. As described above, the hydrogen nuclei are aligned in the direction of the static magnetic field due to the static magnetic field before the RF pulse is applied. When the RF pulse is applied, the magnetization directions of the hydrogen nuclei of the different tissues are rotated, and when the RF pulse is cut off, the magnetization directions of the hydrogen nuclei of the different tissues recover to the direction of the static magnetic field due to the static magnetic field. Hydrogen nuclei have chemical shifts and properties that vary according to the tissues that include the hydrogen nuclei. For example, the hydrogen nuclei of the first tissue may have a higher recovery speed at which the magnetization direction recovers than that of the hydrogen nuclei of the second tissue. An angle is formed between the magnetization directions of the hydrogen nuclei of the first and second tissues due to a difference in a recovery speed between the first and second tissues. The control unit 260 determines whether a magnetization direction of the hydrogen nuclei having a higher recovery speed at which the magnetization direction recovers to a state before the RF pulse was applied from among the two tissues has recovered to the state before the RF pulse was applied.

Whether the magnetization direction of the hydrogen nuclei has recovered to a state before the RF pulse was applied may be determined by determining whether a time from when the magnetization direction of the hydrogen nuclei was rotated when the RF pulse was applied to when the magnetization direction has recovered to a state before the RF pulse was applied, that is, to a direction of the static magnetic field that is previously formed, has elapsed. The control unit 260 controls the RF driving unit 240 such that an RF pulse sequence is not applied to the subject until a predetermined period of time has elapsed after the RF pulse is applied. That is, the control unit 260 lets a predetermined period of time elapse after the RF pulse is applied to the subject.

As described above, when a 180° RF pulse is applied to the subject, the magnetization directions of the hydrogen nuclei of the first tissue and the second tissue in the subject are rotated by 180°, and after a predetermined period of time elapses after the 180° RF pulse is applied, the hydrogen nuclei of the first tissue and the second tissue in the subject recover to their original magnetization directions. However, there is a difference in a recovery time between the magnetization directions of the hydrogen nuclei in the first tissue and the second tissue.

A spin-lattice relaxation time, in other words, a $T_1$ relaxation time, characterizes a rate at which a magnetization direction of hydrogen nuclei recovers. When the RF pulse is applied to the subject and the magnetization direction that is aligned by the static magnetic field is rotated by an angle corresponding to the RF pulse, a spin-lattice relaxation time refers to a time from when the RF pulse is applied to a time when the magnetization direction has recovered by 63.2% $(1-(1/e))$ to the magnetization direction aligned by the static magnetic field. Spin-spin relaxation as well as spin-lattice relaxation also occurs because rotation phases of the plurality of hydrogen nuclei that are ordered before the magnetization of the hydrogen nuclei recover to a direction of the static magnetic field gradually become disordered and random. A spin-spin relaxation time may also be calculated. The spin-spin relaxation time may be referred to as a $T_2$ relaxation time. When the RF pulse is applied to the subject, the hydrogen nuclei in the subject are excited to a high-energy state. The spin-spin relaxation time is a time from when the RF pulse is applied to a time when the energy of the hydrogen nuclei decays to 36.8% $(1/e)$ of the energy in the high-energy state. While the spin-lattice relaxation time indicates recovery of a magnetization direction to the longitudinal direction of the subject (a direction of a z axis), the spin-spin relaxation time indicates a loss of magnetization in a transverse direction (a direction in an xy plane).

When it takes a short time for the magnetization direction of the hydrogen nuclei of the first tissue to recover and it takes a long time for the magnetization direction of the hydrogen nuclei of the second tissue to recover, the magnetization direction of the hydrogen nuclei of the first tissue will recover before the magnetization direction of the hydrogen nuclei of the second tissue recovers, and thus an angle between the magnetization directions of the hydrogen nuclei of the first and second tissue may be up to 180°. For example, when the first tissue is water and the second tissue is cerebrospinal fluid, hydrogen nuclei of the water have a spin-lattice relaxation time of 1000 milliseconds in a static magnetic field of 1.5 Tesla, and hydrogen nuclei of the cerebrospinal fluid have a spin-lattice relaxation time of 4200 to 4500 milliseconds in a static magnetic field of 1.5 Tesla. Accordingly, even after a magnetization direction of the hydrogen nuclei of the water has completely recovered to a direction of the static magnetic field, the magnetization direction of the hydrogen nuclei of the cerebrospinal fluid has not yet recovered. Accordingly, the control unit 260 determines whether a time taken for the magnetization direction of the hydrogen nuclei of the water to recover that has already been measured has elapsed. Alternatively, when the first tissue is silicone and the second tissue is fat, hydrogen nuclei of the silicone have a spin-lattice relaxation time of 950 milliseconds in a static magnetic field of 1.5 Tesla, and hydrogen nuclei of the fat have a spin-lattice relaxation time of 250 milliseconds in a static magnetic field of 1.5 Tesla. Accordingly, the control unit 260 determines whether a time taken for the magnetization direction of the hydrogen nuclei of the fat to recover that has already been measured has elapsed.

In operation 510, when it is determined that the magnetization direction of the hydrogen nuclei of any one tissue has recovered to a state before the RF pulse was applied, that is, when it is determined that a time taken for the magnetization direction of the hydrogen nuclei of any one tissue to recover to a state before the RF pulse was applied has elapsed, the method proceeds to operation 520. In operation 520, the control unit 260 controls the RF driving unit 240 to apply an RF pulse sequence so that the RF coil unit 226 applies an RF pulse sequence to the subject. The RF pulse sequence may be any of various RF pulse sequences such as a spin-echo pulse sequence and a gradient-echo pulse sequence.

In operation 330, the RF coil unit 226 obtains a magnetic resonance signal from the different tissues of the subject in response to the RF pulse sequence. The obtained magnetic resonance signal is digitized and transmitted to the MRI processor, and the MRI processor reconstructs a magnetic resonance image from the digitized magnetic resonance signal.

Figure 6:
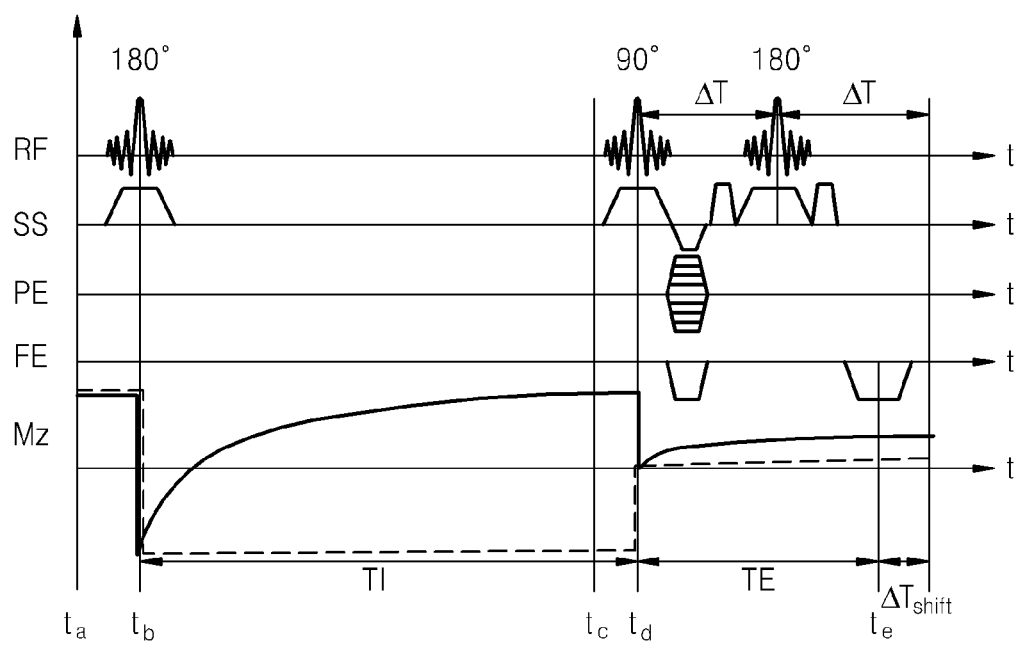
FIG. 6 is a diagram illustrating an example of a radio-frequency (RF) pulse sequence.
Figure 7:
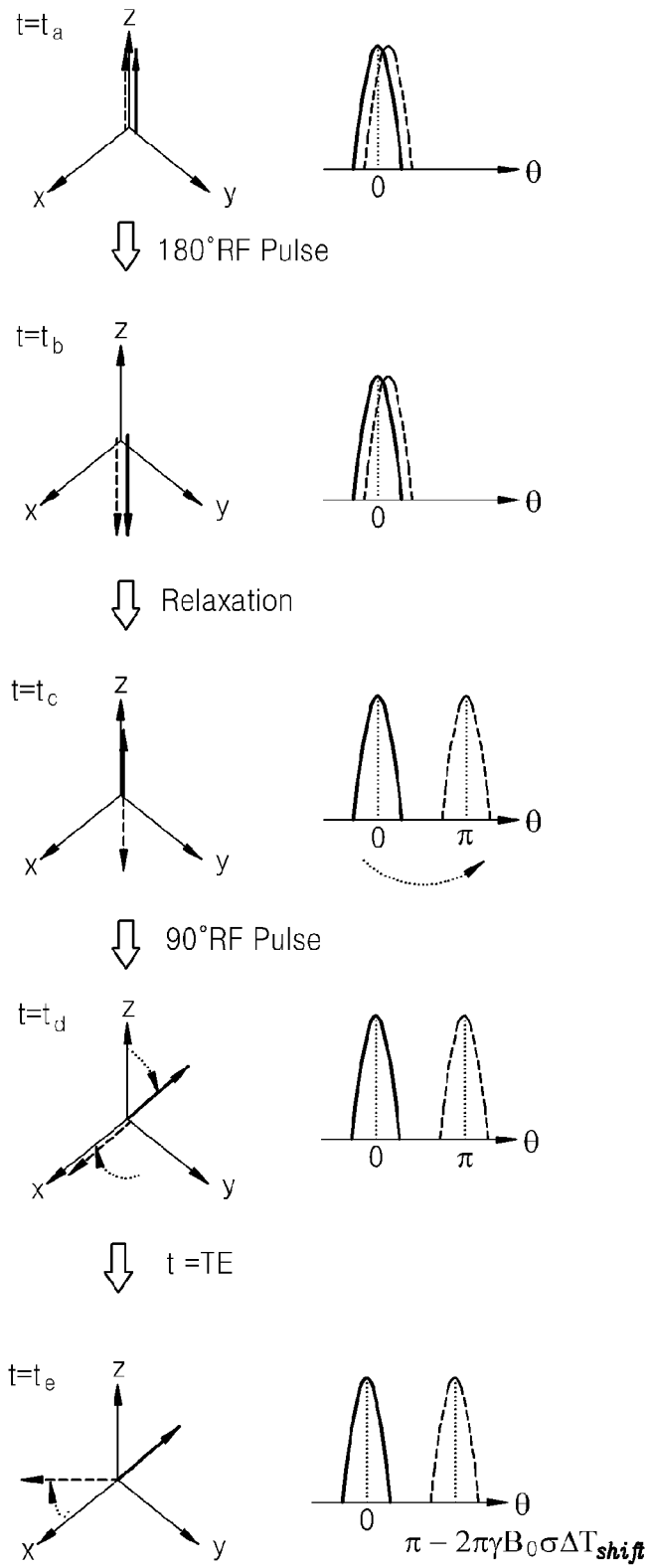
FIG. 7 is a diagram illustrating an example of magnetization directions of hydrogen nuclei of two tissues in a subject at time points of the RF pulse sequence illustrated in FIG. 6.

FIG. 6 is a diagram illustrating an example of an RF pulse sequence. FIG. 7 is a diagram illustrating an example of magnetization directions of hydrogen nuclei of two tissues in a subject at time points of the RF pulse sequence illustrated in FIG. 6. A method of obtaining a magnetic resonance signal by applying an RF pulse and an RF pulse sequence will be explained with reference to FIGS. 6 and 7.

FIG. 6 illustrates signals of the RF coil unit 226 and the gradient coil unit 224. On the vertical axis, RF denotes a high-frequency wave applied by the RF coil unit 226. SS denotes a slice selection gradient applied by the gradient coil unit 224. PE denotes a phase encoding gradient applied by the gradient coil unit 224. FE denotes a frequency encoding gradient applied by the gradient coil unit 224. Mz denotes magnetization, and indicates magnetization directions in FIG. 6. A horizontal axis represents time, TI denotes an inversion time, and TE denotes an echo time.

FIG. 7 illustrates examples of magnetization directions of hydrogen nuclei of two tissues in a coordinate system including x, y, and z-axes (where the z-axis is a longitudinal direction of a subject, a slice axis, and a direction of a static magnetic field) indicated by a solid line and a dashed line. For example, the magnetization direction indicated by the solid line is a magnetization direction of hydrogen nuclei of water, and the magnetization direction indicated by the dashed line is a magnetization direction of hydrogen nuclei of cerebrospinal fluid. A detailed description of material well known to one of ordinary skill in the art will not be provided, and the following explanation will focus on a relationship between signals and a magnetization direction at time points of the RF pulse sequence illustrated in FIG. 6.

At a time $t^a$ in FIG. 6, the subject is located in a static magnetic field formed by the main magnetic field coil unit 222. Magnetization directions of hydrogen nuclei of the two tissues in the subject are aligned in a direction of the static magnetic field due to the static magnetic field. At this time, the solid line and the dashed line of the magnetization Mz in FIG. 6 indicate that the two tissues have the same magnetization direction. As can be seen from FIG. 7, the magnetization directions of the hydrogen nuclei in the two tissues are both aligned in a direction of a +z-axis. Since the two magnetization directions of the hydrogen nuclei in the two tissues are the same, an angle between the two magnetization directions is 0°.

At a time $t_b$ in FIG. 6, the RF coil unit 226 applies an RF pulse to the subject. A gradient magnetic field has already been formed in the subject in a direction of a z-axis, and a frequency of the RF pulse is proportional to an intensity of the gradient magnetic field formed in a specific portion of the subject corresponding to a target region. Also, the RF pulse has a frequency band including resonance frequencies of the hydrogen nuclei of the two tissues. The RF pulse is a 180° RF pulse as shown in FIGS. 6 and 7, and may be any of various types of RF pulses, such as a sinc function in a time domain. Referring to FIGS. 6 and 7, the magnetization directions of the hydrogen nuclei in the two tissues of the subject are opposite to the magnetization directions before the RF pulse was applied due to the 180° RF pulse applied by the RF coil unit 226. Referring to FIG. 7, since the solid line and the dashed line are aligned in the direction of the −z-axis and indicate that the two magnetization directions of the hydrogen nuclei in the two tissues are the same, an angle between the two magnetization directions is 0°.

After the time $t_b$, the RF pulse is cut off, and due to the static magnetic field already formed in the subject, the magnetization of the hydrogen nuclei in the two tissues of the subject relaxes. Relaxation of the magnetization means that the hydrogen nuclei excited by the RF pulse recover to a stable state, that is, to a direction of the static magnetic field. Due to a difference in a spin-lattice relaxation time, in other words, a $T_1$ relaxation time, of the hydrogen nuclei in the two tissues, since the time it takes for the magnetization direction of the hydrogen nuclei to recover to a state before the RF pulse was applied is different for each of the two tissues, an angle between the two magnetization directions increases as time passes. Referring to FIG. 6, a value of the magnetization (Mz) indicated by the solid line quickly changes from negative (−) to positive (+), and recovers to a value before the RF pulse was applied by the time the inversion time TI has elapsed. However, a value of the magnetization (Mz) indicated by the dashed line hardly changes, and does not recover to a value before the RF pulse was applied by the time the inversion time TI has elapsed. As a result, the magnetization direction indicated by the solid line recovers to a direction of the static magnetic field before the RF pulse was applied, while the magnetization direction indicated by the dashed line hardly changes after the RF pulse is applied.

At a time $t_c$ in FIG. 6, the magnetization directions of the hydrogen nuclei in the two tissues in the subject are opposite to each other. In FIG. 7, the solid line is aligned in the direction of the +z-axis like at the time $t_a$, and the dashed line is aligned in the direction of the −z-axis like at the time $t_b$. As a result, since the two magnetization directions are opposite to each other, an angle between the two magnetization directions is 180°.

When the RF pulse is applied at the time $t_b$ and relaxation occurs from the time $t_b$ to the time $t_c$, the magnetization directions of the hydrogen nuclei in the two tissues in the subject become opposite to each other, and thus a phase difference occurs between the hydrogen nuclei of the two tissues.

At a time $t_d$ in FIG. 6, the RF coil unit 226 applies an RF pulse sequence for obtaining a magnetic resonance signal to the subject. Although a spin-echo pulse sequence consisting of a 90° RF pulse followed by a 180° RF pulse is shown in FIG. 6, this example is not limited thereto, and a gradient-echo pulse sequence may be used instead.

First, at the time $t_d$, a 90° RF pulse is applied to the subject. Accordingly, the magnetization directions of the hydrogen nuclei in the two tissues change to directions in an xy plane perpendicular to the direction of the +z-axis and the direction of the −z-axis from the direction of the +z-axis and the direction of the −z-axis. However, an angle between the magnetization directions of the hydrogen nuclei in the two tissues is maintained at 180° in the xy plane. The hydrogen nuclei of the two tissues then precess at their resonance frequencies, thereby generating a phase difference between signals generated by the two tissues.

After a time interval ΔT from the time $t_d$ has elapsed, the phase difference between the signals of the two tissues is reversed by applying a 180° RF pulse to the subject. After a time interval 2ΔT from the time $t_d$ has elapsed (the sum of the two time intervals ΔT in FIG. 6), signals generated by the two tissues have the same phase. As shown in FIG. 6, a time between the time $t_d$ and a time $t_e$ in FIG. 6, that is, between the time $t_d$ and a time obtained by subtracting a time interval $\Delta T_{shift}$ from a time obtained when the time interval 2ΔT from the time $t_d$ has elapsed, is referred to as the echo time (TE).

The time $t_e$ is a time when the echo time TE (2ΔT−$\Delta T_{shift}$) from the time $t_d$ has elapsed, and magnetic resonance signals generated by the two tissues may be obtained at the time $t_e$. The magnetic resonance signals are a sum of magnetic resonance signals generated by the two tissues, and a phase difference θ expressed by the following Equation 2 occurs between the magnetic resonance signals generated by the two tissues.

$$\theta = \pi - 2\pi\gamma B_0 \sigma \Delta T_{shift} \tag{2}$$

In Equation 2, γ is a gyromagnetic ratio, which is 42.58 MHz/T in the case of the hydrogen nuclei, $B_0$ is an intensity of the static magnetic field, σ is a chemical shift difference between the hydrogen nuclei of the two tissues, and $\Delta T_{shift}$ is a time interval that is subtracted from the time interval 2ΔT to obtain the echo time TE. A user may control $\Delta T_{shift}$ using the user interface that may be included in the MRI controller 130 in FIG. 1 as discussed above, and accordingly θ is a phase difference that is controllable by the user.

An angle between the magnetization directions of the hydrogen nuclei in the two tissues is π (180°) before the time $t_d$, and then an additional phase difference of $2\pi\gamma B_0 \sigma \Delta T_{shift}$ occurs at the time at which the echo time TE ends due to the time $t_e$ at which the echo time TE ends being shifted by $\Delta T_{shift}$ from the time at which the time interval 2ΔT from the time $t_d$ ends as shown in FIG. 6.

The signal obtaining unit 250 obtains magnetic resonance signals derived from the hydrogen nuclei of the two tissues by using the RF coil unit 226. A two-dimensional (2D) k-space of a target region of the subject is formed in MRI. The k-space is a frequency domain obtained by performing Fourier transformation on the target region of the subject. The control unit 260 outputs a signal for forming a gradient magnetic field by controlling the gradient driving unit 230, and the gradient coil unit 224 forms a gradient magnetic field in the directions of each of the x-axis, y-axis, and z-axis.

In order to form a k-space, the target region of the subject whose magnetic resonance image is to be generated must be specified, and 2D spatial information of the target region must be obtained. To this end, a gradient magnetic field is formed in the direction of the z-axis, and a slice selection gradient is applied to select an xy plane perpendicular to the z-axis. In order to obtain 2D spatial information in the selected slice plane, a frequency encoding gradient and a phase encoding gradient are applied. In order to obtain the 2D spatial information, a specific phase difference in the direction of the y-axis between magnetic resonance signals in the selected slice plane is generated using the phase encoding gradient, and then the signal obtaining unit 250 obtains a k-space signal corresponding to one line of the k-space by generating a specific frequency difference in the direction of the x-axis using the frequency encoding gradient for the position on the y-axis where the specific phase difference is generated. The signal obtaining unit 250 uniformly obtains magnetic resonance signals for all lines of the k-space by repeatedly performing a process of obtaining a k-space signal by generating a specific frequency difference in the direction of the x-axis for another position on the y-axis using the frequency encoding gradient and the phase encoding gradient.

The signal obtaining unit 250 obtains the magnetic resonance signals generated by the two tissues of the target region of the subject, digitizes the magnetic resonance signals, and transmits the digitized magnetic resonance signals to the MRI processor 130, and the MRI processor 130 reconstructs a magnetic resonance image from the magnetic resonance signals.

When a magnetic resonance image signal of the first tissue is $I_1(x, y)$ and a magnetic resonance image signal of the second tissue is $I_2(x, y)$, a sum of the magnetic resonance image signals of the target region of the subject may be subjected to 2D Fourier transformation, and may be expressed by the following Equation 3.

$$I(x, y) = (I_1(x, y) + I_2(x, y)e^{j\theta})e^{j\phi(x, y)} \tag{3}$$

In Equation 3, φ(x, y) is a phase error due to field inhomogeneity, system imperfection, and differences in magnetic susceptibility of the two tissues. Equation 3 is similar to a 1-point Dixon (1PD) method, except that θ is controllable by a user in Equation 3. Accordingly, images of the two tissues may be separated by obtaining $I_1(x, y)$ and $I_2(x, y)$ from one image signal I(x, y) by using any of various conventional 1PD-based methods.

Once φ(x, y) has been obtained through calculation or estimation, magnetic resonance image signals of the first tissue and the second tissue may be separated using the following Equations 4, 5, and 6.

$$I'(x, y) = I(x, y)e^{-j\phi(x,y)} \tag{4}$$
$$= I_1(x, y) + I_2(x, y)e^{j\theta}$$

$$I_1(x, y) = \operatorname{Re}\{I'(x, y)\} - I_2(x, y)\cos\theta \tag{5}$$

$$I_2(x, y) = \frac{\operatorname{Im}\{I'(x, y)\}}{\sin\theta} \tag{6}$$

In Equation 5, Re denotes the real part of the expression in brackets, and in Equation 6, Im denotes the imaginary part of the expression in brackets.

In MRI, it is difficult to differentiate tissues using conventional methods unless there is a sufficient difference in a chemical shift between the tissues. However, in the methods disclosed in this application, since a magnetic resonance image is obtained based on a difference in magnetization directions of atomic nuclei between different tissues, the tissues may be effectively differentiated from each other.

The MRI processor 130, the gradient driving unit 230, the RF driving unit 240, the signal obtaining unit 250, and the control unit 260 described above may be implemented using one or more hardware components, one or more software components, or a combination of one or more hardware components and one or more software components.

A hardware component may be, for example, a physical device that physically performs one or more operations, but is not limited thereto. Examples of hardware components include amplifiers, low-pass filters, high-pass filters, band-pass filters, analog-to-digital converters, digital-to-analog converters, registers, arithmetic units, functional units, memory devices, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A magnetic resonance imaging (MRI) method comprising:
    applying a radio-frequency (RF) pulse to a subject comprising different tissues all comprising a same type of atomic nuclei to rotate magnetization directions of the atomic nuclei of the different tissues;
    applying an RF pulse sequence to the subject based on the magnetization directions of the atomic nuclei of the different tissues; and
    obtaining magnetic resonance signals from the different tissues in response to the RF pulse sequence.

2. The MRI method of claim 1, wherein the applying of the RF pulse sequence comprises:
    determining whether a time required for the magnetization direction of the atomic nuclei of any one of the different tissues to recover to a state of the magnetization direction before the RF pulse was applied has elapsed since the RF pulse was applied; and
    when a result of the determining is that the time has elapsed, applying the RF pulse sequence to the subject.

3. The MRI method of claim 2, wherein the state of the magnetization direction before the RF pulse was applied is a state in which the magnetization direction is aligned in a direction of a static magnetic field that existed in the subject before the RF pulse was applied.

4. The MRI method of claim 2, wherein the time depends on a difference in a spin-lattice relaxation time of the atomic nuclei between the different tissues.

5. The MRI method of claim 2, wherein the time depends on a difference in a spin-spin relaxation time of the atomic nuclei between the different tissues.

6. The MRI method of claim 1, wherein the applying of the RF pulse sequence comprises applying a first RF pulse of the RF pulse sequence when an angle between the magnetization directions of the atomic nuclei of two of the different tissues is 180°.

7. The MRI method of claim 1, wherein the different tissues have spectrums indicating chemical shifts that overlap one another.

8. The MRI method of claim 1, wherein one of the different tissues is water, and another one of the different tissues is cerebrospinal fluid.

9. The MRI method of claim 1, wherein one of the different tissues is silicone, and another one of the different tissues is fat.

10. The MRI method of claim 1, wherein the RF pulse has a frequency band comprising resonance frequencies of the atomic nuclei of the different tissues.

11. The MRI method of claim 1, wherein the RF pulse sequence is a spin-echo pulse sequence or a gradient-echo pulse sequence.

12. A non-transitory computer-readable storage medium storing a program for controlling a computer to perform the MRI method of claim 1.

13. The MRI method of claim 1, wherein the applying of the RF pulse sequence comprises applying the RF pulse sequence to the subject based on a difference in the magnetization directions of the atomic nuclei of the different tissues.

14. The MRI method of claim 13, wherein the difference in the magnetization directions of the atomic nuclei of the different tissues is caused by a difference between respective relaxation times of the atomic nuclei of the different tissues.

15. An magnetic resonance imaging (MRI) apparatus comprising:
    a radio-frequency (RF) coil unit configured to apply, to a subject comprising different tissues all comprising a same type of atomic nuclei, an RF pulse to rotate magnetization directions of the atomic nuclei of the different tissues, and an RF pulse sequence;
    a control unit configured to determine a time when the RF pulse sequence is to be applied based on the magnetization directions of the atomic nuclei of the different tissues; and
    a signal obtaining unit configured to obtain the magnetic resonance signals from the different tissues in response to the RF pulse sequence.

16. The MRI apparatus of claim 15, wherein the control unit is further configured to:
    determine whether a time required for the magnetization direction of the atomic nuclei of any one of the different tissues to recover to a state of the magnetization direction before the RF pulse was applied has elapsed since the RF pulse was applied; and
    apply the RF pulse sequence to the subject when the control unit determines that the time has elapsed.

17. The MRI apparatus of claim 16, wherein the state of the magnetization direction before the RF pulse was applied is a state in which the magnetization direction is aligned in a direction of a static magnetic field that existed in the subject before the RF pulse was applied.

18. The MRI apparatus of claim 16, wherein the time depends on a difference in a spin-lattice relaxation time of the atomic nuclei between the different tissues.

19. The MRI apparatus of claim 16, wherein the time depends on a difference in a spin-spin relaxation time of the atomic nuclei between the different tissues.

20. The MRI apparatus of claim 15, wherein the different tissues have spectrums indicating chemical shifts that overlap one another.

21. The MRI apparatus of claim 15, wherein the RF pulse has a frequency band comprising resonance frequencies of the atomic nuclei of the different tissues.

22. The MRI apparatus of claim 15, wherein the RF pulse is a 180° RF pulse.

* * * * *